(12) United States Patent
Dauzat et al.

(10) Patent No.: US 11,612,069 B2
(45) Date of Patent: Mar. 21, 2023

(54) HINGE FOR ENCLOSURE FOR ELECTRICAL NETWORK PROTECTION ELEMENT

(71) Applicant: GENERAL ELECTRIC COMPANY, Schenectady, NY (US)

(72) Inventors: Thomas Ambrose Dauzat, Shreveport, LA (US); Cecilia Espinoza Diaz, Nuevo Leon (MX); Luis Sanchez Cabral, Nuevo Leon (MX)

(73) Assignee: General Electric Technology GmbH, Baden (CH)

( * ) Notice: Subject to any disclaimer, the term of this patent is extended or adjusted under 35 U.S.C. 154(b) by 0 days.

(21) Appl. No.: 16/811,581

(22) Filed: Mar. 6, 2020

(65) Prior Publication Data

US 2020/0214152 A1 Jul. 2, 2020

Related U.S. Application Data

(63) Continuation-in-part of application No. 15/845,077, filed on Dec. 18, 2017, now Pat. No. 10,587,100.

(51) Int. Cl.
*H05K 5/00* (2006.01)
*H05K 5/02* (2006.01)

(52) U.S. Cl.
CPC ......... *H05K 5/0226* (2013.01); *H05K 5/0008* (2013.01)

(58) Field of Classification Search
None
See application file for complete search history.

(56) References Cited

U.S. PATENT DOCUMENTS

| | | | |
|---|---|---|---|
| 5,199,369 A | 4/1993 | Meyer et al. | |
| 5,669,105 A * | 9/1997 | Depke | E05D 7/0027 16/244 |
| 5,839,766 A * | 11/1998 | Iannuzzi | E06B 9/80 292/144 |
| 5,992,098 A | 11/1999 | Flider et al. | |
| 6,421,229 B1 | 7/2002 | Campbell et al. | |
| 6,640,498 B1 | 11/2003 | Groeneveld | |
| 7,096,540 B2 * | 8/2006 | Watanabe | H04M 1/0212 16/337 |
| 9,379,526 B2 | 6/2016 | Bier et al. | |
| 10,587,100 B2 | 3/2020 | Dauzat et al. | |
| 2003/0001465 A1 | 1/2003 | Carter et al. | |
| 2004/0100770 A1 | 5/2004 | Chu et al. | |

(Continued)

*Primary Examiner* — Courtney L Smith
(74) *Attorney, Agent, or Firm* — Eversheds Sutherland (US) LLP

(57) ABSTRACT

The disclosure generally relates to an exemplary hinge of an enclosure that can house an electrical network protection element and provide protection to the electrical network protection element against damage in various environments such as when the enclosure is placed in an underground vault that may be flooded during rain, or when a liquid (e.g., oil) comes into contact with the enclosure. The hinge may include two portions, one portion attached to one or more doors of the enclosure and one portion attached to a housing of the enclosure. The hinge may be configured such that it may be adjusted in multiple directions (for example, beyond one plane of rotation that typical hinges may offer), and thus allow for greater adjustability of the one or more doors of the enclosure relative to the housing of the enclosure.

12 Claims, 8 Drawing Sheets

(56) References Cited

U.S. PATENT DOCUMENTS

| | | | |
|---|---|---|---|
| 2005/0120517 A1* | 6/2005 | Bonham | E05D 3/10 16/238 |
| 2005/0183238 A1* | 8/2005 | McCue | E05D 7/0027 16/236 |
| 2005/0198779 A1* | 9/2005 | Jung | H04M 1/0212 16/367 |
| 2006/0180301 A1 | 8/2006 | Baer | |
| 2007/0169316 A1* | 7/2007 | Lu | G06F 1/1681 16/367 |
| 2008/0282503 A1* | 11/2008 | Chen | H04M 1/0212 16/342 |
| 2009/0045203 A1 | 2/2009 | Ehrlich | |
| 2010/0154166 A1* | 6/2010 | Chien | G06F 1/1681 16/250 |
| 2010/0232096 A1* | 9/2010 | Chen | G06F 1/1681 361/679.01 |
| 2010/0246130 A1* | 9/2010 | Paquette | H01Q 1/02 361/704 |
| 2011/0149480 A1* | 6/2011 | Leeman | H02B 1/36 361/608 |
| 2012/0194044 A1* | 8/2012 | Niedzwiecki | E05C 9/1808 312/215 |
| 2013/0293076 A1 | 11/2013 | Karandikar et al. | |
| 2015/0075080 A1 | 3/2015 | Ellingson | |
| 2015/0282363 A1 | 10/2015 | Bier et al. | |
| 2016/0337037 A1 | 11/2016 | Fevrier | |
| 2018/0139859 A1 | 5/2018 | Reese et al. | |
| 2019/0190241 A1 | 6/2019 | Dauzat et al. | |
| 2020/0106247 A1 | 4/2020 | Dauzat et al. | |
| 2020/0214158 A1 | 7/2020 | Dauzat et al. | |

* cited by examiner

HINGE FOR ENCLOSURE FOR ELECTRICAL NETWORK PROTECTION ELEMENT

FIELD OF THE DISCLOSURE

This disclosure relates to enclosures, and more particularly, to an enclosure for housing an electrical network protection element, and more particularly to a hinge for the enclosure.

BACKGROUND OF THE DISCLOSURE

An electrical protection element such as a circuit breaker or a fuse is typically used to protect a circuit, a device, or a system from being damaged due to an abnormal condition such as an over-voltage condition or an over-current condition. The characteristics of the electrical protection element are defined in large part by the nature of the application where the electrical protection element is used. Thus, a small fuse may be adequate to protect an electronic circuit board while a heavy-duty circuit breaker may be required to protect a transformer in an electric utility facility. Furthermore, the fuse used in the electronic circuit board may be selected without any undue attention being paid to a waterproofing aspect of the fuse. On the other hand, the heavy-duty circuit breaker may require specific attention to be paid to environmental factors such as temperature, humidity, and moisture, because the transformer may be exposed to natural elements such as the sun, rain, and snow. Consequently, in such applications, the electrical protection element may be placed inside a protective housing such as a utility hut or a water-proof enclosure.

In some cases, an electrical protection element may be housed inside a water-proof enclosure that is installed inside an underground structure. While it is expected that water would not normally flow into the underground structure, in some situations such as during heavy rainfall, water may enter the underground structure. The water-proof enclosure must therefore be constructed to prevent this water from coming in contact with the electrical protection element.

In some other cases, an electrical protection element may be housed inside a water-proof enclosure that is submerged under water, such as a body of water. Here again, the water-proof enclosure must be constructed to prevent water from coming in contact with the electrical protection element.

The water-proof enclosure must however, allow a person such as a technician, to open the water-proof enclosure in order to gain access to the electrical protection element for various reasons, such as to replace parts or to make a visual inspection of the electrical protection element. Consequently, such conflicting requirements should be taken into consideration when designing a water-proof enclosure. Some conventional solutions fail to satisfy at least some of these conflicting requirements, thereby exposing the electrical protection element to potential damage and/or making it difficult for a technician to access the electrical protection element.

Additionally, enclosure hinge design may be of importance as the hinge may not only need to act as a pivot point for opening and closing the enclosure, but may also allow for uniform gasket compression without pinching the gasket in those areas close to the hinge. The hinge may also allow for horizontal movement on the two or multiple door halves to be pulled into one another, not just to overlay, in order to provide a superior gas and/or liquid tight seal and no hardware threads to be exposed to crevice corrosion.

BRIEF SUMMARY OF THE DISCLOSURE

Embodiments of the disclosure can provide an enclosure for protecting electrical components from external environmental conditions, for example if the enclosure is placed underwater. More particularly, embodiments of the disclosure can provide a hinge on the enclosure that is configured to allow adjustability of a door of the enclosure relative to a housing of the enclosure, where the adjustability allows for movement of the hinge in multiple directions.

In at least one embodiment, an enclosure can be provided. The enclosure may include a housing having an interior portion configured to accommodate an electrical network protection element. The enclosure may also include one or more doors hingeably attached to the housing through one or more hinges, the one or more hinges. The one or more hinges may include a first portion coupled to the one or more doors, the first portion comprising a first horizontal slotted hole for receiving a first fastening element, and one or more first vertical holes for receiving one or more second fastening elements. The one or more hinges may also include a second portion coupled to the housing, the second portion comprising a second horizontal threaded hole for receiving the first fastening element, and one or more second vertical holes for receiving the one or more second fastening elements, wherein the first portion and second portion are connected through the first fastening element and the one or more second fastening elements. In some embodiments, the first horizontal slotted hole and second horizontal threaded hole are configured to allow for rotation of the first portion about a horizontal axis and the one or more first vertical holes and one or more second vertical holes are configured to allow for rotation of the first portion about a vertical axis. In some embodiments, at least one of the first horizontal slotted hole, the first horizontal slotted hole, the one or more first vertical holes, the second horizontal threaded hole, and the one or more second vertical holes include a threaded portion.

In at least one aspect of some embodiments, a hole size is greater than a corresponding fastening element received by the hole, the hole comprising at least one of: the first horizontal slotted hole, the one or more first vertical holes, the second horizontal threaded hole, and the one or more second vertical holes.

In at least one aspect of some embodiments, the first portion of the one or more hinges further comprises one or more third horizontal holes that are perpendicular to the first horizontal slotted hole, and wherein the one or more third horizontal holes are configured to receive one or more third fastening elements, the first portion of the one or more hinges being coupled to the one or more doors through the one or more third fastening elements in the one or more third horizontal holes.

In at least one aspect of some embodiments, the threaded portion of at least one of the first horizontal slotted hole, the one or more first vertical holes, the second horizontal threaded hole, and the one or more second vertical holes is unexposed to an external environmental of the one or more hinges.

In at least one embodiment, an enclosure can be provided. The enclosure may include a housing having an interior portion configured to accommodate an electrical network protection element. The enclosure may also include one or more doors hingeably attached to the housing through one or more hinges, the one or more hinges comprising. The one or more hinges may include a first portion coupled to the one or more doors, the first portion comprising a first horizontal slotted hole for receiving a first fastening element, and one or more first vertical holes for receiving one or more second fastening elements. The one or more hinges may also include a second portion coupled to the housing, the second portion comprising a second horizontal threaded hole for receiving the first fastening element, and one or more second vertical holes for receiving the one or more second fastening elements, wherein the first portion and second portion are connected through the first fastening element and the one or more second fastening elements.

In at least one aspect of some embodiments, a hole size is greater than a corresponding fastening element received by the hole, the hole comprising at least one of: the first horizontal slotted hole, the one or more first vertical holes, the second horizontal threaded hole, and the one or more second vertical holes.

In at least one aspect of some embodiments, the first horizontal slotted hole and second horizontal threaded hole are configured to allow for rotation of the first portion about a horizontal axis and the one or more first vertical holes and one or more second vertical holes are configured to allow for rotation of the first portion about a vertical axis.

In at least one aspect of some embodiments, the first portion of the one or more hinges further comprises one or more third horizontal holes that are perpendicular to the first horizontal slotted hole, and wherein the one or more third horizontal holes are configured to receive one or more third fastening elements, the first portion of the one or more hinges being coupled to the one or more doors through the one or more third fastening elements in the one or more third horizontal holes.

In at least one aspect of some embodiments, the second portion of the one or more hinges is coupled to the housing through one or more fourth fastening elements or is welded to the housing.

In at least one aspect of some embodiments, at least one of the first horizontal slotted hole, the one or more first vertical holes, the second horizontal threaded hole, and the one or more second vertical holes included a threaded portion.

In at least one aspect of some embodiments, the first fastening elements and one or more second fastening elements comprise threaded hardware.

In at least one aspect of some embodiments, a threaded portion of at least one of the first horizontal slotted hole, the one or more first vertical holes, the second horizontal threaded hole, and the one or more second vertical holes is unexposed to an external environmental of the one or more hinges.

In at least one embodiment, a hinge can be provided. The hinge may include a first portion comprising a first horizontal slotted hole for receiving a first fastening element, and one or more first vertical holes for receiving one or more second fastening elements. The hinge may also include a second portion comprising a second horizontal threaded hole for receiving the first fastening element, and one or more second vertical holes for receiving the one or more second fastening elements, wherein the first portion and second portion are connected through the first fastening element and the one or more second fastening elements.

In at least one aspect of some embodiments, a hole size is greater than a corresponding fastening element received by the hole, the hole comprising at least one of: the first horizontal slotted hole, the one or more first vertical holes, the second horizontal threaded hole, and the one or more second vertical holes.

In at least one aspect of some embodiments, the first horizontal slotted hole and second horizontal threaded hole are configured to allow for rotation of the first portion about a horizontal axis and the one or more first vertical holes and one or more second vertical holes are configured to allow for rotation of the first portion about a vertical axis.

In at least one aspect of some embodiments, the first portion of the hinge further comprises one or more third horizontal holes that are perpendicular to the first horizontal slotted hole, and wherein the one or more third horizontal holes are configured to receive one or more third fastening elements, the first portion of the hinge being coupled to one or more doors through the one or more third fastening elements in the one or more third horizontal holes.

In at least one aspect of some embodiments, the second portion of the hinge is coupled to a housing through one or more fourth fastening elements or is welded to the housing In at least one aspect of some embodiments, at least one of the first horizontal slotted hole, the one or more first vertical holes, the second horizontal threaded hole, and the one or more second vertical holes included a threaded portion.

In at least one aspect of some embodiments, the first fastening elements and one or more second fastening elements comprise threaded hardware.

Additional systems, methods, apparatus, features, and aspects can be realized through the techniques of various embodiments of the disclosure. Other embodiments and aspects of the disclosure are described in detail herein and are considered a part of the claimed subject matter. Other features can be understood and will become apparent with reference to the description and to the drawings.

BRIEF DESCRIPTION OF THE DRAWINGS

Figure 1:
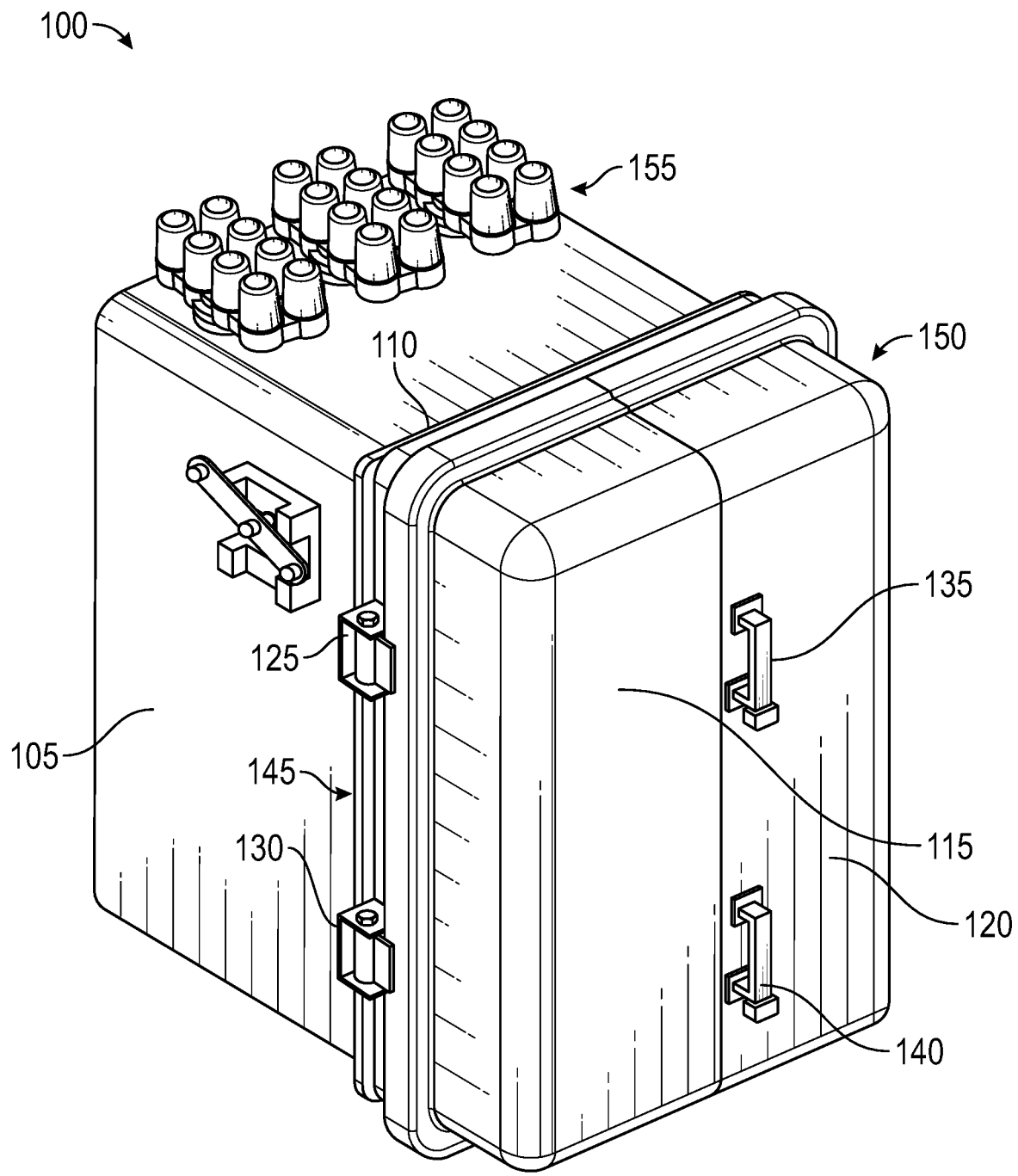

Having thus described the disclosure in general terms, reference will now be made to the accompanying drawings, which are not necessarily drawn to scale, and wherein:

FIG. 1 shows a perspective view of an exemplary enclosure that can house an electrical network protection element in accordance with an exemplary embodiment of the disclosure.

Figure 2:
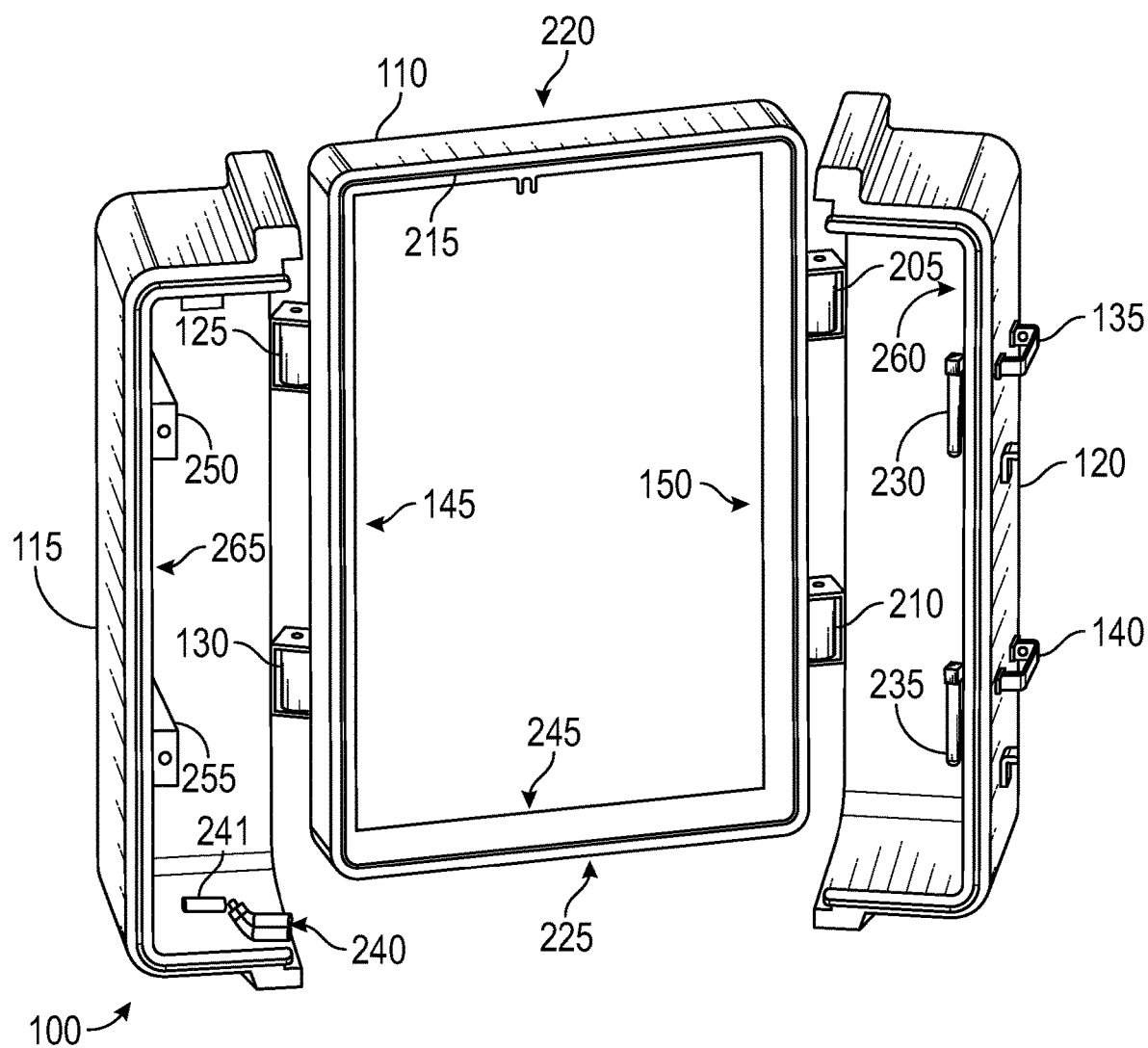

FIG. 2 shows a view of a flange when two doors of the exemplary enclosure shown in FIG. 1 are in an open position.

Figure 3:
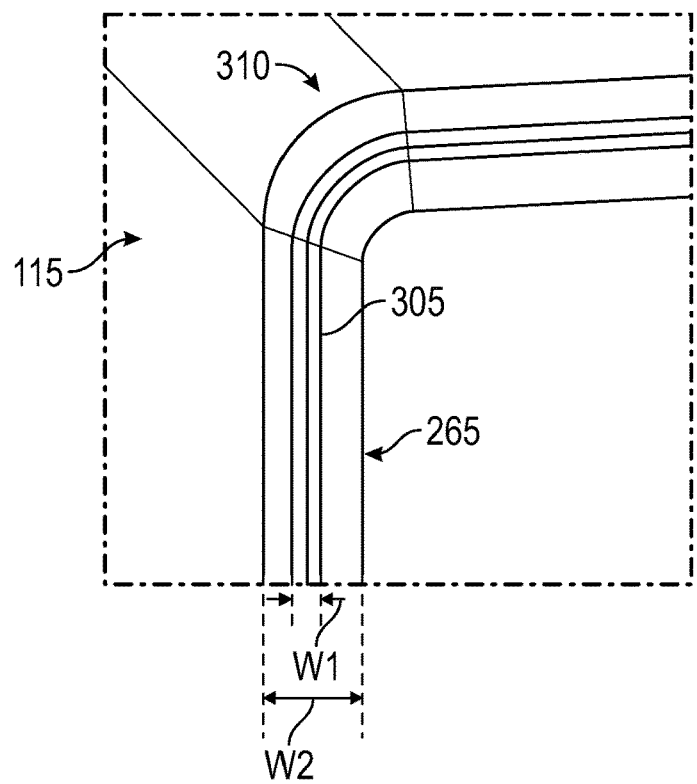

FIG. 3 shows a wedge projection in a beveled inner edge of a first door of the exemplary enclosure shown in FIG. 1.

Figure 4:
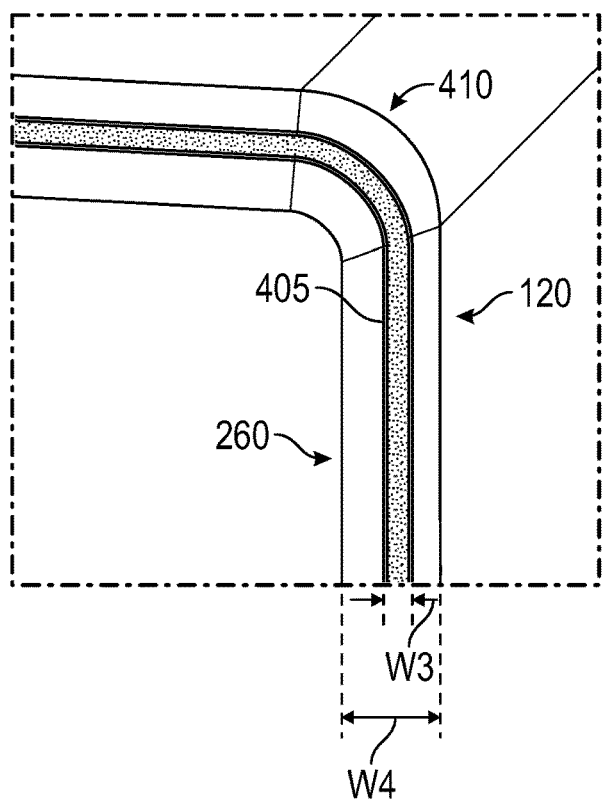

FIG. 4 shows a gasket disposed along a complementary beveled inner edge of a second door of the exemplary enclosure shown in FIG. 1.

Figure 5:
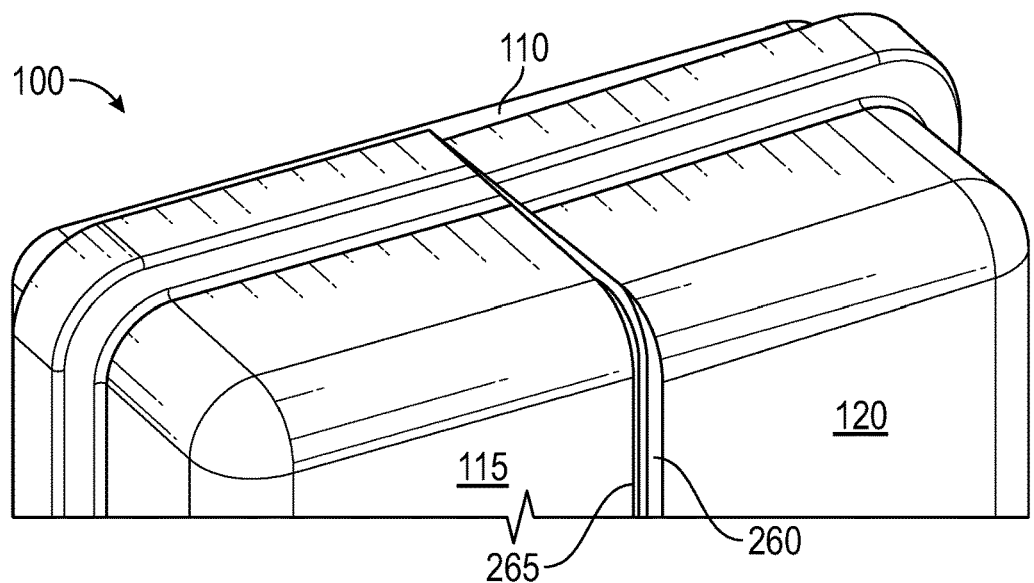

FIG. 5 shows the beveled inner edges of the two doors of the exemplary enclosure shown in FIG. 1 when in a partially closed position.

Figure 6:
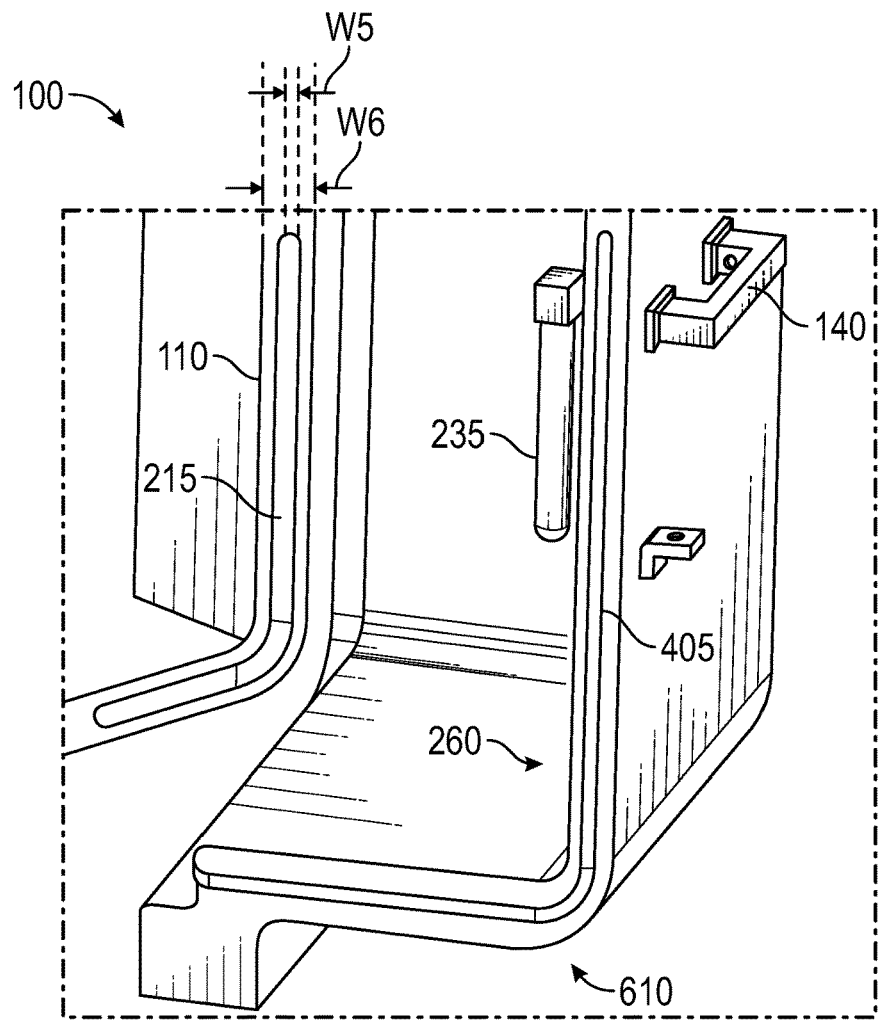

FIG. 6 shows an exemplary handle attached to the second door of the exemplary enclosure shown in FIG. 1.

Figure 7:
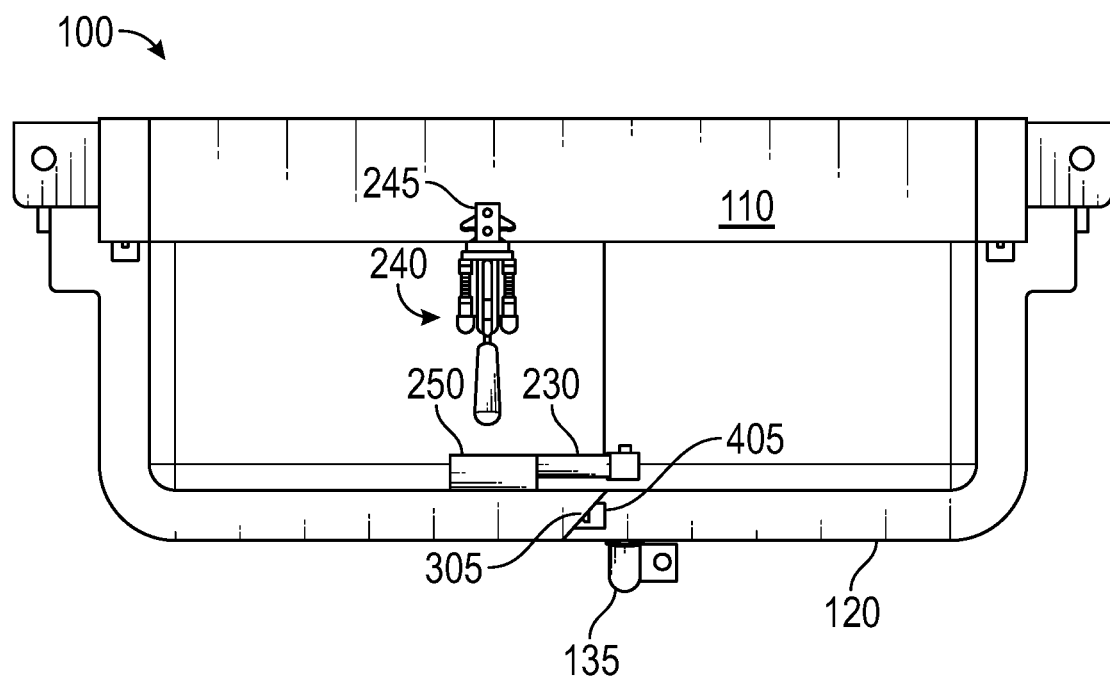

FIG. 7 shows an upper section view of an exemplary toggle clamp attached to an internal surface of the first door of the exemplary enclosure shown in FIG. 1.

Figure 8:
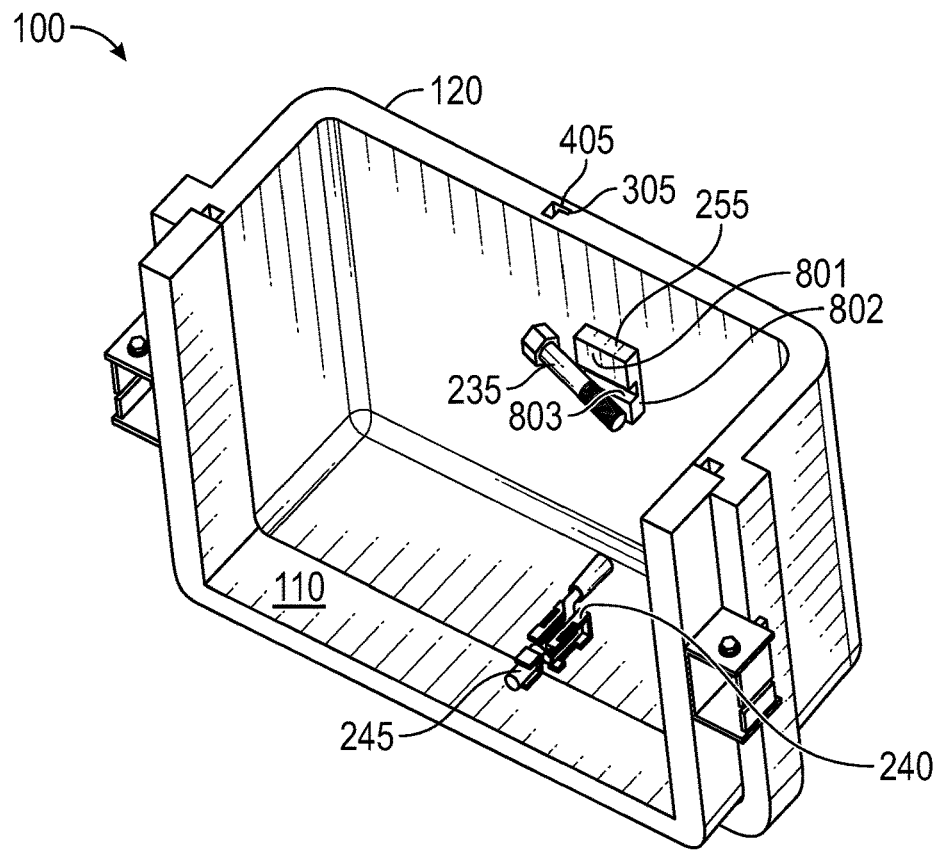

FIG. 8 illustrates a perspective view of a locking bar of the exemplary handle prior to being seated in a groove in a wedge block on an internal major surface of a door of the exemplary enclosure shown in FIG. 1.

Figure 9:
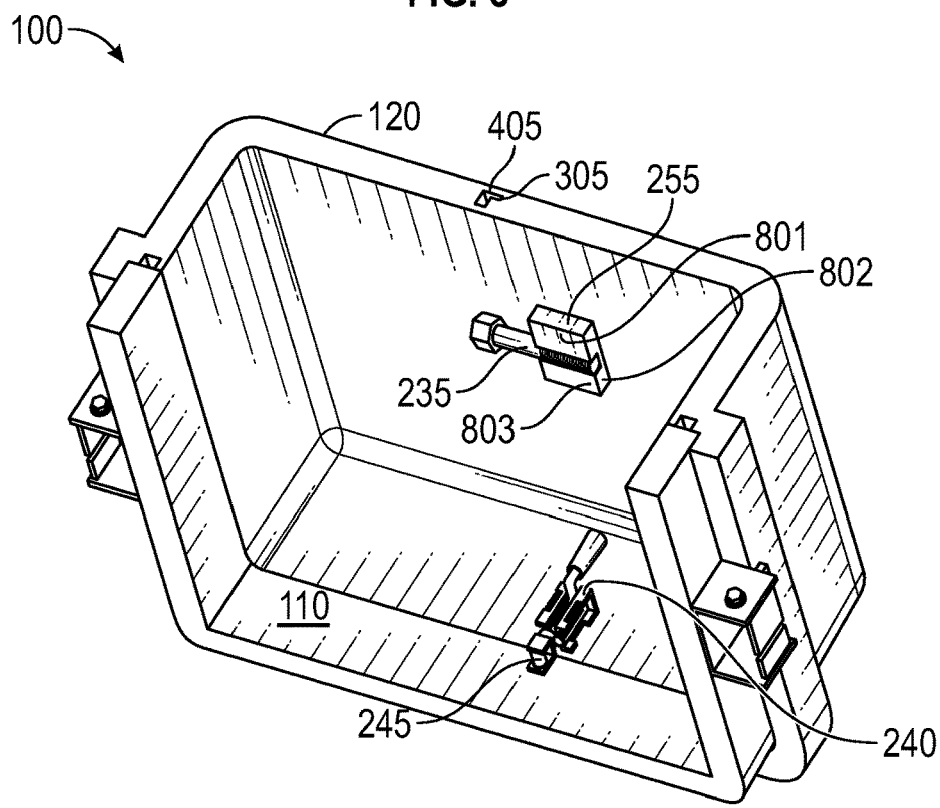

FIG. 9 illustrates the locking bar of the exemplary handle after being seated in the groove in the wedge block shown in FIG. 8.

Figure 10:
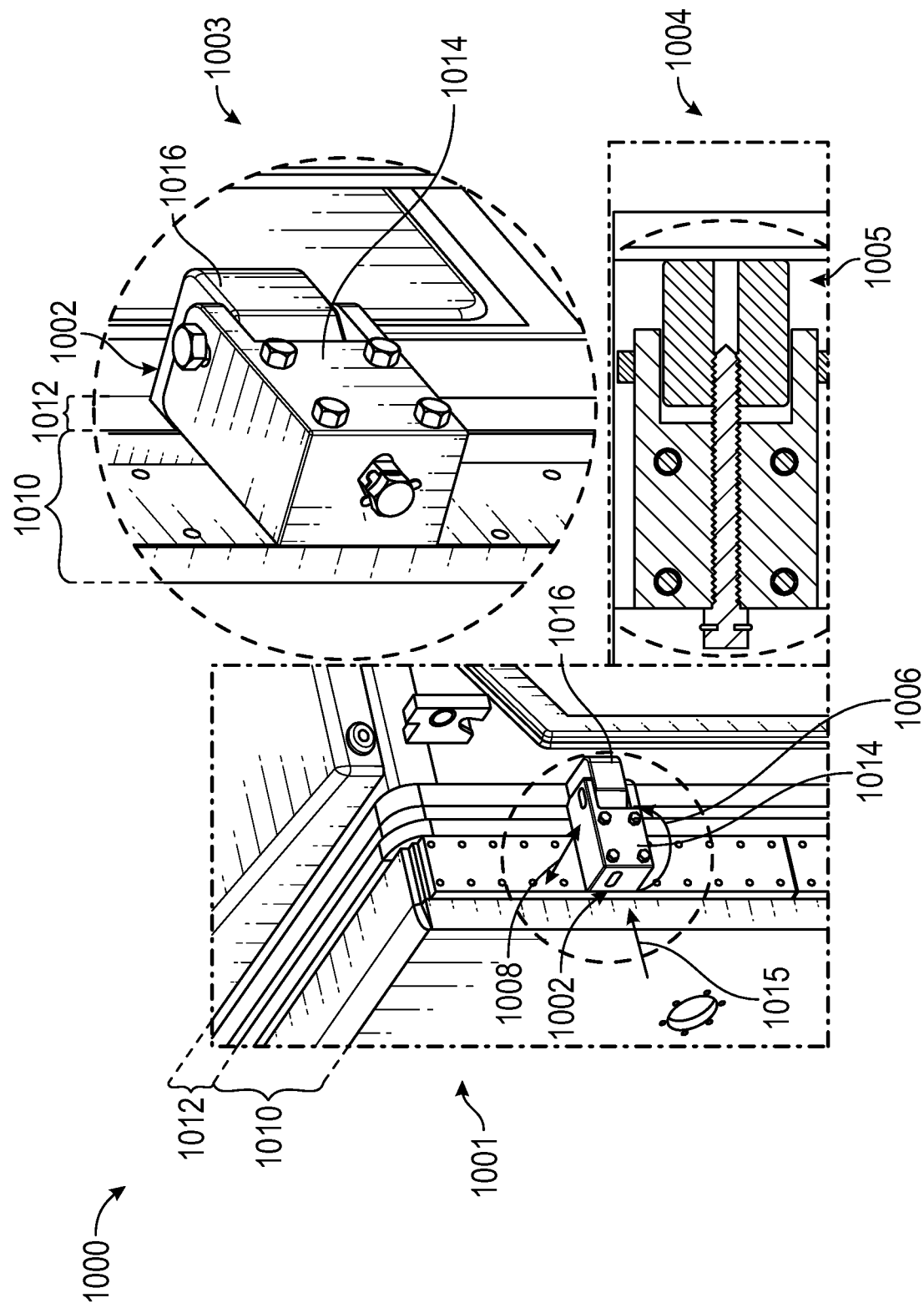

FIG. 10 illustrates an example hinge of the exemplary enclosure.

Figure 11:
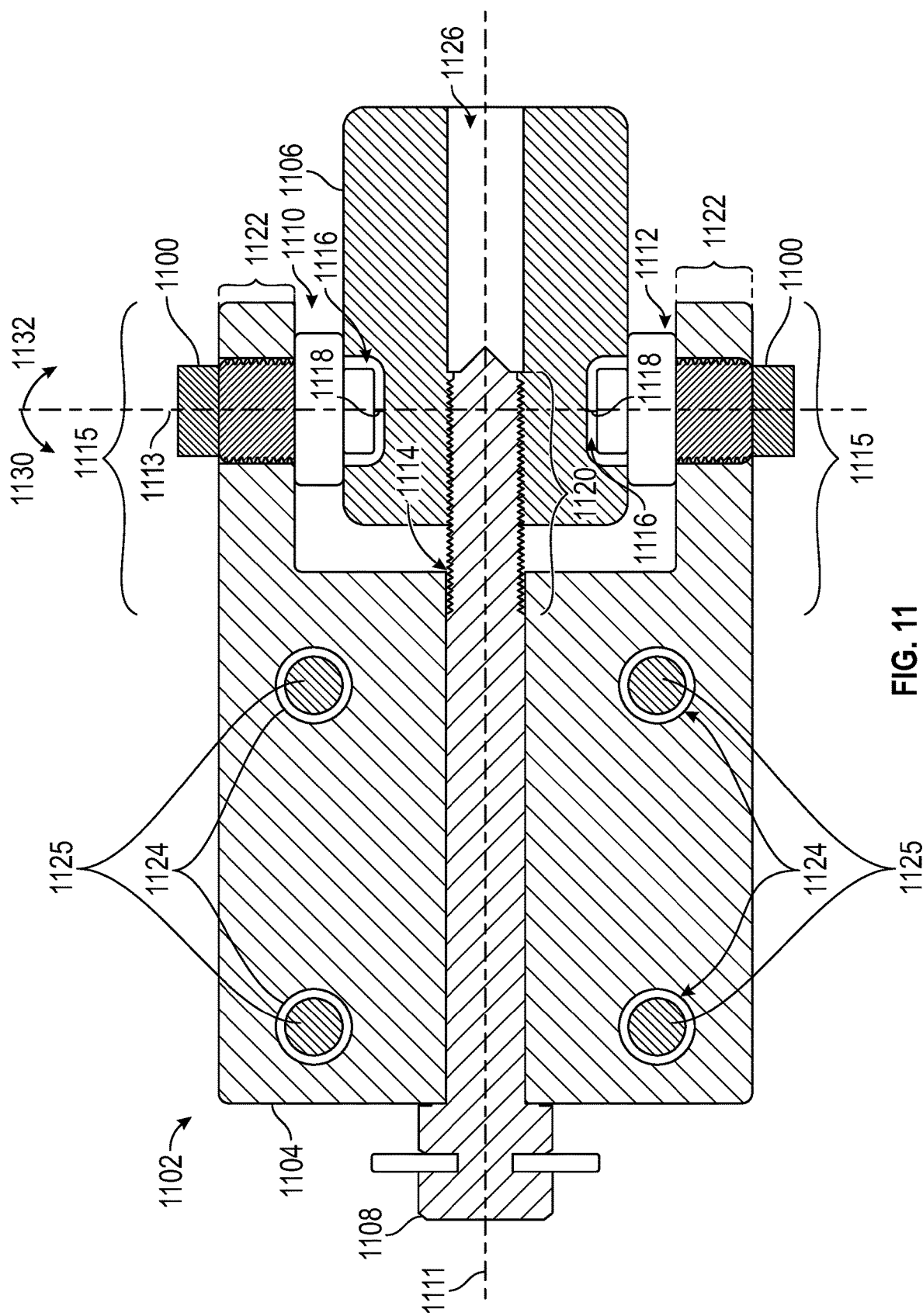

FIG. 11 illustrates a cross-sectional view of the example hinge depicted in FIG. 10.

DETAILED DESCRIPTION OF THE DISCLOSURE

The disclosure will be described more fully hereinafter with reference to the accompanying drawings, in which exemplary embodiments of the disclosure are shown. This disclosure may, however, be embodied in many different forms and should not be construed as limited to the exemplary embodiments set forth herein; rather, these embodiments are provided so that this disclosure will satisfy applicable legal requirements. Like numbers refer to like elements throughout. It should be understood that certain words and terms are used herein solely for convenience and such words and terms should be interpreted as referring to various objects and actions that are generally understood in various forms and equivalencies by persons of ordinary skill in the art. For example, the word "gasket" as used herein refers to any of various types of gaskets such as a sealing gasket, a compression gasket, a race gasket, or a perimeter gasket. The phrase "wedge projection" as used herein may be alternatively understood as a "knife edge projection" or an "angular projection." It should also be understood that various words that pertain to an orientation, a mounting location, or a shape of an object (words such as "horizontal," "vertical," "upper," "lower," "right," and "left," for example) are used herein for describing one or more exemplary embodiments and should be interpreted as being equally applicable to other exemplary embodiments in terms of other orientations, locations, and shapes.

Furthermore, the description below may refer to a left-side door as a "first door" and a right-side door as a "second door." This is done solely for purposes of convenience and it should be understood that the various elements and operations described with respect to the first door and the second door in one example implementation are interchangeable in various other implementations. For example, a door handle that is described herein as being mounted on the second door in one example implementation can instead be mounted on the first door in an alternative implementation. A toggle clamp that is described as being attached to an internal surface of the first door in one example implementation can be attached to an internal surface of the second door in an alternative implementation. The dimensions of the two doors, and certain symmetrical features of the two doors, as shown in the figures is merely for illustrating some exemplary implementations. In other exemplary implementations, the two doors may have different shapes and dimensions (different widths, for example). The word "example" as used herein is intended to be non-exclusionary and non-limiting in nature. More particularly, the word "exemplary" as used herein indicates one among several examples, and it should be understood that no undue emphasis or preference is being directed to the particular example being described.

In terms of a general overview, described herein is an exemplary embodiment of a hinge for an exemplary enclosure as described herein (descriptions specific to the hinge may be found below with respect to FIGS. 10 and 11). The exemplary enclosure, includes a housing that can house an electrical network protection element and provides protection to the electrical network protection element against damage in various environments such as when the enclosure is placed in an underground vault that may be flooded during rain, or when a liquid (oil, for example) comes in contact with the enclosure. The enclosure includes a flange attached to the housing and two doors that are hingeably attached to the flange. A wedge projection is provided all along the perimeter of the flange and facing away from the housing. A gasket is provided on the outer three edges of each door, the gasket arranged to sealingly receive the wedge projection of the flange when the doors are closed against the flange. The first door also includes a beveled inner edge having a wedge projection that projects away from the housing. The second door includes a complementary beveled inner edge having a gasket that sealingly receives the wedge projection located in the beveled inner edge of the first door when the doors are closed against the flange. The exemplary enclosure may include additional elements such as a toggle clamp that is attached to an internal surface of the first door. When the toggle clamp is engaged with a catch located in the flange, the first door is automatically pulled towards the flange and sealingly compresses the gasket provided on the outer three edges of the door against the wedge projection provided along the perimeter of the flange.

FIG. 1 shows a perspective view of an exemplary enclosure 100 for an electrical network protection element (not shown), in accordance with an exemplary embodiment of the disclosure. The enclosure 100 is configured to provide waterproofing when completely submerged in water or when in contact with various types of liquids. The electrical network protection element is accommodated inside an interior portion of a housing 105 of the enclosure 100. In some implementations, air is evacuated from the interior portion of the housing 105 and replaced with an inert gas that helps prevent or minimize oxidation of various components of the electrical network protection element while also preventing or minimizing entry of water into the interior portion.

A flange 110 is attached to the housing 105 (by welding, for example) or can be manufactured as an integral part of the housing 105. The flange 110 can include a first knuckle 125 and a second knuckle 130, each of which is a part of a hinge. A first attachment element such as a bolt, a screw, or a pin, is inserted into the first knuckle 125 and a second attachment element is similarly inserted into the second knuckle 130 for hingeably attaching a first door 115 to a first vertical side 145 of the flange 110. Two other similar knuckles (205 and 210 shown in FIG. 2) may be used to hingeably attach a second door 120 to a second vertical side 150 of the flange 110. In other implementations, a single knuckle or more than two knuckles may be provided as parts of one or more hinges for hingeably attaching each of the first door 115 and the second door 120 to respective vertical sides of the flange 110.

The flange 110, which may be a square flange or a rectangular flange for example, has a wedge-shaped projection (shown in FIG. 2) located all along a perimeter of the flange 110 and projecting away from the housing 105. The wedge-shaped projection will be described below in more detail. The first door 115 includes a gasket (not shown) that sealingly receives the wedge projection of the flange 110 when the first door 115 is closed. The gasket, which is made of a compressible material, such as rubber, is operative as a watertight seal that prevents or minimizes water from entering the housing 105 via the upper edge, the lower edge, and the outer vertical edge of the first door 115. The gasket may include several sections that may be independent of each other or may be constituent parts of a unitary gasket.

Thus, in one exemplary implementation, the gasket can be a unitary gasket that extends along the three outer edges of the first door 115 (the upper edge, the lower edge, and the outer vertical edge). In another exemplary implementation, the gasket can include multiple sections. A first section of the gasket is disposed along an upper edge of the first door 115, a second section of the gasket is disposed along a lower edge of the first door 115, and a third section of the gasket is disposed along an outer vertical edge of the first door 115. The first door 115 further includes a beveled inner edge having a wedge-shaped projection that projects away from the housing and extends all along the beveled inner edge of the first door 115. The beveled inner edge of the first door 115 includes a vertical portion extending along the front vertical surface of the first door 115 and horizontal portions extending along the upper and lower horizontal surfaces of the first door 115.

The second door 120 includes a gasket (not shown) that sealingly receives the wedge-shaped projection of the flange 110 when the second door 120 is closed. The gasket, which is made of a compressible material, such as rubber, is operative as a watertight seal that prevents or minimizes water from entering the housing 105 via the upper edge, the lower edge, and the outer vertical edge of the second door 120. The gasket may include several sections that may be independent of each other or may be constituent parts of a unitary gasket.

Thus, in one exemplary implementation, the gasket can be a unitary gasket that extends along the three outer edges of the second door 120 (the upper edge, the lower edge, and the outer vertical edge). In another exemplary implementation, the gasket can include multiple sections. A first section of the gasket is disposed along an upper edge of the second door 120, a second section of the gasket is disposed along a lower edge of the second door 120, and a third section of the gasket is disposed along an outer vertical edge of the second door 120. The second door 120 further includes a beveled inner edge having a gasket (not shown) that sealingly mates with the wedge-shaped projection provided in the beveled inner of the first door 115 when the second door 120 is closed. The beveled inner edge of the second door 120 includes a vertical portion extending along the front vertical surface of the second door 120 and horizontal portions extending along the upper and lower horizontal surfaces of the second door 120.

One or more handles, such as a first handle 135 and a second handle 140 are mounted on a front external surface of the second door 120. Further details pertaining to these two handles are provided below.

A set of terminals 155 may be provided on an upper surface of the housing 105. One or more of the set of terminals 155, which can be connected via cable, bars, or wires to the network protection element inside the housing 105, may be used for connecting the network protection element to equipment (not shown) located outside the housing 105.

FIG. 2 shows a view of the flange 110 when both the first door 115 and the second door 120 are placed in an open position. The flange 110 includes the first vertical side 145, the second vertical side 150, an upper horizontal side 220, and a lower horizontal side 225. A wedge-shaped projection 215 is provided all along the perimeter of the flange 110 and facing away from the housing. A gasket is provided on the outer three edges of the first door 115 sealingly receives the wedge-shaped projection 215 when the first door 115 is closed against the flange 110. The outer three edges of the first door 115 correspond to the first vertical side 145, a left-half portion of the upper horizontal side 220, and a left-half portion of the lower horizontal side 225 of the flange 110. Another gasket that is provided on the outer three edges of the second door 120 sealingly receives the wedge-shaped projection 215 when the second door 120 is closed against the flange 110. The outer three edges of the second door 120 correspond to the second vertical side 150, a right-half portion of the upper horizontal side 220, and a right-half portion of the lower horizontal side 225 of the flange 110.

The wedge-shaped projection 215 sealingly engages with the gasket in each of the first door 115 and the second door 120 to provide a waterproof seal along all four sides of the flange 110 for preventing or at least minimizing entry of water or other liquids into the interior portion of the housing 105.

As indicated above, the first door 115 is hingeably attached to the first vertical side 145 by using a first hinge that includes the first knuckle 125 and a second hinge that includes the second knuckle 130. The second door 120 is hingeably attached to the second vertical side 150 by similarly using a first hinge that includes a first knuckle 205 and a second hinge that includes a second knuckle 210.

The second door 120 also includes the first handle 135 and the second handle 140 mounted on a front external surface of the second door 120. The first handle 135 is shown as having a horizontal orientation that can correspond to a default condition when the second door 120 is in the open position. A locking rod 230 is coupled to the first handle 135 such that the locking rod 230 is oriented in a substantially orthogonal direction to the first handle 135. Consequently, the locking rod 230 has a vertical orientation (upwards or downwards in alternative exemplary implementations) when the first handle 135 is oriented horizontally. The locking rod 230 can be coupled to the first handle 135 in other angular orientations in other exemplary implementations. The structure and operation of the second handle 140 can be similar to the first handle 135.

A toggle clamp 240 can be attached to a lower internal surface of the first door 115. In an alternative exemplary implementation, the toggle clamp 240 can be attached to an upper internal surface of the first door 115. The toggle clamp 240 includes a handle 241 that can be operated manually to engage the toggle clamp 240 with a catch 245 that is located in the flange 110. In an exemplary operation, the second door 120 is left in the open position and the first door 115 is swung shut to an initial closed position wherein the gasket along the three edges of the first door 115 comes in contact with a corresponding portion of the wedge-shaped projection 215 in the flange 110. A human operator (a technician, for example) then reaches in through the opening where the second door 120 is open and flips the handle 241 in the first door 115 towards the catch 245. In one exemplary implementation, the toggle clamp 240 is an adjustable toggle clamp that allows the handle 241 to be engaged with the catch 245. The action of manually flipping the handle 241 and engaging with the catch 245 pulls the first door 115 towards the flange 110 and sealingly compresses the gasket in the first door 115 against the corresponding portion of the wedge-shaped projection 215 in the flange 110.

The second door 120 can now be closed after having closed and sealed the first door 115. Closing the second door 120 can be carried out in two operations. In the first operation, the second door 120 is swung shut to an initial closed position wherein the gasket along the three edges in the second door 120 comes in contact with a corresponding portion of the wedge-shaped projection 215 in the flange 110. In the second operation, the first handle 135 is manually operated (by the technician, for example) to move the first handle 135 from the horizontal orientation to a vertical orientation (upwards or downwards in alternative exemplary implementations). The locking rod 230 that is coupled to the first handle 135 correspondingly moves from the vertical orientation to a horizontal orientation. In doing so, the locking rod 230 comes in contact with one of two sloping contact surfaces located on either side of a groove in a wedge-shaped block 250 that is located on an internal major surface of the first door 115. Each sloping contact surface is configured to provide a continuously incremental amount of pushing force that compressingly pushes the gasket along the three edges in the second door 120 against the corresponding portion of the wedge-shaped projection 215 in the flange 110 until the locking rod is seated in the groove in the wedge block. This aspect is described below in more detail using other figures.

The second step of manually operating the first handle 135 also provides for a sealed closure of a beveled inner edge 260 of the second door 120 with a beveled inner edge 265 of the first door 115. The beveled inner edge 265 of the first door 115 includes a wedge-shaped projection 305 (shown in FIG. 3) that projects towards the beveled inner edge 260 of the second door 120. The beveled inner edge 260 of the second door 120 includes a gasket 405 (shown in FIG. 4) arranged to sealingly receive the wedge-shaped projection located in the first door 115, when the second door 120 is closed and the first handle 135 is operated.

It should be understood that the second handle 140 can be operated in a manner similar to that described above with reference to first handle 135. The locking rod 235 coupled to the second handle 140 engages a wedge-shaped block 255 that can be similar to the wedge-shaped block 250.

FIG. 3 shows the wedge-shaped projection 305 in the beveled inner edge 265 of the first door 115. The beveled inner edge 265 can have a bevel angle such as about 45 degrees with respect to external major surfaces (front, upper, and lower surfaces) of the first door 115. The beveled inner edge 265 can also can include chamfers at the corners, such as a chamfered corner 310 where a front major surface of the first door 115 meets the upper major surface of the first door 115. In one exemplary implementation, the width "w1" of the wedge-shaped projection 305 provided along the beveled inner edge 265 can be less than the thickness "w2" of the first door 115. In another exemplary implementation, the width "w1" of the wedge-shaped projection 305 provided along the beveled inner edge 265 can be substantially equal to the thickness "w2" of the first door 115.

FIG. 4 shows the gasket 405 disposed along the beveled inner edge 260 of the second door 120. The gasket 405 is arranged to sealingly receive the wedge-shaped projection 305 located in the first door 115, when the second door 120 is closed and one or both of the first handle 135 and the second handle 140 is operated. The bevel angle of the beveled inner edge 260 of the second door 120 is configured to complement the bevel angle of the beveled inner edge 265 of the first door 115. Consequently, when the beveled inner edge 265 of the first door 115 has a bevel angle of about 45 degrees, the beveled inner edge 260 of the second door 120 is also selected to have a bevel angle of about 45 degrees. The beveled inner edge 260 can also can include chamfers at the corners, such as a chamfered corner 410 where a front major surface of the second door 120 meets the upper major surface of the second door 120.

In one exemplary implementation, the width "w3" of the gasket 405 provided along the beveled inner edge 260 can be less than the thickness "w4" of the second door 120. In another exemplary implementation, the width "w3" of the gasket 405 can be substantially equal to the thickness "w4" of the second door 120.

The gasket 405 can be one of many types of gaskets and can be disposed along the beveled inner edge 260 of the second door 120 in various ways, such as by using a channel gasket that is disposed in a channel, or by using a sealing gasket that is attached to the beveled inner edge 260 by using an adhesive.

FIG. 5 shows the beveled inner edge 260 of the second door 120 next to the beveled inner edge 265 of the first door 115 as the second door 120 is moved to a partially closed position after the first door 115 is closed and sealed by operating the toggle clamp 240. The gap that is seen between the beveled inner edge 260 of the second door 120 next and the beveled inner edge 265 of the first door 115 is closed and compressively sealed after the second door 120 is fully closed and one or both of the first handle 135 and the second handle 140 is operated. When compressively sealed, the wedge-shaped projection 305 (shown in FIG. 3) provided along the beveled inner edge 265 of the first door 115 compressively mates with the gasket 405 (shown in FIG. 4) located in the beveled inner edge 260 of the second door 120.

FIG. 6 shows a close-up view of the second handle 140 that is attached to the second door 120. The locking rod 235 is pointing downwards because the second handle 140 is in the default condition when the second door 120 is in the open position. The portion of the beveled inner edge 260 that is shown in FIG. 6 includes a chamfered corner 610 where a front major surface of the second door 120 meets the lower major surface of the second door 120. Also shown, is a portion of the wedge-shaped projection 215 that is provided all along the perimeter of the flange 110 that is attached to the housing 105.

FIG. 7 shows an upper section view of the exemplary toggle clamp 240 attached to an internal surface of the first door 115. As shown, the toggle clamp 240 is engaged with the catch 245 that is provided in the flange 110. Also shown, is the door handle 135 in a position where the second door 120 is in the closed position and the locking rod 230 is seated in the groove in the wedge-shaped block 250 provided in the first door 115. In an alternative exemplary implementation, the door handle 135 can be located on the first door 115 and the wedge-shaped block 250 can be located on the second door 120. Similarly, the toggle clamp 240 can be provided in the second door 120 instead of the first door 115 and the catch 245 aligned accordingly in the flange 110. When so provided, the second door 120 is closed first, followed by manually operating the toggle clamp 240 to engage with the catch 245. The first door 115 can then be closed and sealed by operating one or more door handles such as the door handle 135 located on the first door 115.

FIG. 8 illustrates a perspective view of the locking bar 235 of the second handle 140 that is mounted on the front external surface of the second door 120 according to an exemplary embodiment of the disclosure. An upwards movement of the second handle 140 initiated by a technician (not shown) for locking the second door 120 causes the locking bar 235 to come in contact with a bottom end of a first sloping contact surface 803 of the wedge block 255. The first sloping contact surface 803 is configured to provide a continuously incremental amount of pushing force that compressingly pushes the gasket 405 disposed along the beveled inner edge 260 of the second door 120 against the wedge-shaped projection 305 in the beveled inner edge 265 of the first door 115 until the locking rod 235 engages with the groove 802 in the wedge block 255.

Alternatively, when the second handle 140 is configured to be moved downwards for locking the second door 120, a downwards movement of the second handle 140 initiated by the technician (not shown) for locking the second door 120 causes the locking bar 235 to come in contact with an upper end of a second sloping contact surface 801 of the wedge block 255. The second sloping contact surface 801 is configured to provide a continuously incremental amount of pushing force that compressingly pushes the gasket 405 disposed along the beveled inner edge 260 of the second door 120 against the wedge-shaped projection 305 in the beveled inner edge 265 of the first door 115 until the locking rod 235 engages with the groove 802 in the wedge block 255.

In another exemplary implementation, the wedge block 255 can have a single sloping contact surface (one that is either above or below the groove 802) and the second handle 140 configured to be moved only upwards or downwards correspondingly. FIG. 8 also illustrates the toggle clamp 240 (attached to a lower internal surface of the first door 115) engaged with the catch 245 located in the flange 110.

FIG. 9 illustrates the locking bar 235 of the second handle 140 seated in the groove 802 in the wedge block 255 shown in FIG. 8. When so seated, the second door 120 is in a locked condition.

FIG. 10 illustrates an example hinge 1002 of the exemplary enclosure 1000, which may be the same as enclosure 100. FIG. 10 includes three exemplary perspectives of the hinge 1002, including at least a first orthogonal view 1001, a second orthogonal view 1003, and a cross-sectional view 1004 (the cross-sectional view 1004 may also be depicted and described in greater detail with respect to FIG. 11 below). The first orthogonal view 1001 shows the hinge 1002 coupled to the enclosure 1000. The hinge 1002 may include a first portion 1014 and a second portion 1016. The first portion 1014 may be coupled to a door 1010 (which may be the same as the first door 115 or the second door 120 described with respect to FIG. 1, for example, or any other door of the enclosure as described herein) of the enclosure 1000 and the second portion 1016 may be coupled to a housing 1012 (which may be the same as the housing 105 described with respect to FIG. 1, for example, or any other housing of the enclosure as described herein) of the enclosure 1000. The first orthogonal view 1001 also shows exemplary multiple directions of movement that the hinge 1002 is capable of. For example, the hinge 1102 may offer front-to-back 1005 adjustability, side-to-side adjustability 1008, and/or rotational adjustability 1006. The second orthogonal view 1003 may simply be a magnified view of the hinge 1002 as depicted in the first orthogonal view 1001.

FIG. 11 illustrates a cross-sectional view of the example hinge 1102 (which may, for example, be the same as hinge 1002 described with respect to FIG. 10). For example, FIG. 11 may depict a more detailed view of the cross sectional view 1004 depicted and described with respect to FIG. 10. Hinge 1102 may include a first portion 1104 and a second portion 1106 (which may be the same as first portion 1014 and second portion 1016 described with respect to FIG. 10). The first portion 1104 of the hinge 1102 may be removably or permanently attached to a door (not shown in FIG. 11, but may be the same as first door 115 and/or second door 120 with respect to FIG. 1, door 1010 with respect to FIG. 10, or any other door described herein) of an enclosure (not shown in FIG. 11, but may be the same as enclosure 100 described with respect to FIG. 1, enclosure 1000 described with respect to FIG. 10, or any other enclosure described herein) Likewise, the second portion 1106 of the hinge 1102 may be removably or permanently attached to a housing (not shown in FIG. 11, but may be the same as housing 105 described with respect to FIG. 1, or any other housing described herein) of the enclosure. Thus, the hinge 1102 may serve as a connecting point between the door and the housing of the enclosure, and may also allow for adjustability of the door relative to the housing.

In some embodiments, the first portion 1104 of the hinge 1102 may include a first horizontal slotted hole 1114, one or more first vertical holes 1122, and one or more third horizontal holes 1124 that may be perpendicular to the first horizontal slotted hole 1114. The first horizontal slotted hole 1114 may extend through the entire length of the first portion 1104 and may receive a first fastening element 1108, which may be, for example, a bolt, a screw, a sheer bolt, or other type of threaded hardware. The first horizontal slotted hole 1114 may also have a varying slot diameter, such that a diameter of part of the first horizontal slotted hole 1114 may be larger than another a diameter of another part of the first horizontal slotted hole 1114. This may allow for at least some range of motion of the first portion 1104 of the hinge 1102 even when the first fastening element is received within the first horizontal slotted hole 1114. For example, at least movement in a counterclockwise 1132 or clockwise direction 1130 relative to an axis 1113 and/or about the axis 1113, or any other direction extending radially outwards from the first fastening element 1108, to provide a few examples. Additionally, the first horizontal slotted hole 1114 and/or the first fastening element 1108 may allow for rotation of the first portion 1104 of the hinge 1102 or the entirety of the hinge 1102 about an axis 1111. To this end, at least a portion of the first fastening element 1108 (for example, as shown at 1120) to allow the first fastening element 1108 to slide through the first horizontal slotted hole 1114. In some embodiments, the entire first fastening element 1108 and/or first horizontal slotted hole 1114 may be threaded.

In some embodiments, the one or more first vertical holes 1122 of the first portion 1104 of the hinge 1102 may be located on horizontal extensions 1115 of the first portion 1104. The horizontal extensions 1115 may allow the second portion 1106 of the hinge 1102 to align within the first portion 1104 between the horizontal 1115 extensions to allow one or more second fastening elements 1110 to be received within both the first portion 1104 and the second portion 1106 as will be described in further detail below. The one or more first vertical holes 1122 may receive one or more second fastening elements 1110, which may be, for example, a bolt, a screw, a sheer bolt, or any other type of threaded hardware. The one or more first vertical holes 1122 and/or the one or more second fastening elements 1110 may allow for rotation of first portion 1104 of the hinge 1102 or the entirety of the hinge 1102 about an axis 1113. That is, the rotation about the axis 1113 may allow for a door (for example, door 1010 described with respect to FIG. 10, or any other door described herein) to open and close with respect to a housing (for example, housing 1012 described with respect to FIG. 10, or any other housing described herein). Additionally, as with the first horizontal slotted hole 1114 where the first fastening element 1108 may slide through and be threaded into the section portion 1106, at least a portion of the one or more second fastening elements 1110, 1112 as well as the one or more first vertical holes 1122 may be threaded to allow the one or more second fastening elements 1110, 1112 to rotatably engage with the one or more first vertical holes 1122. In some embodiments, the entire one or more second fastening elements 1110, 1112 and/or one or more first vertical holes 1122 may be threaded.

In some embodiments, the one or more third horizontal holes 1124 of the first portion 1104 of the hinge 1102 may be located perpendicularly to the first horizontal slotted hole 1114 on the first portion 1104 of the hinge 1102. The one or more third horizontal holes 1124 may receive one or more third fastening elements 1125, which may be, for example, a bolt, a screw, a sheer bolt, etc. The one or more third horizontal holes 1124 may extend through the entire width of the first portion 1104 so that the one or more third fastening elements 1125 may extend through the one or more third horizontal holes 1124 and into the door of the enclosure, so that the first portion 1104 of the hinge 1102 may be removably coupled to the door through the one or more third fastening elements 1125. Additionally, similarly to the first horizontal slotted hole 1114, the one or more third horizontal holes 1124 may also have a varying diameter, such that a diameter of part of the one or more third horizontal holes 1124 may be larger than another a diameter of another part of the one or more third horizontal holes 1124. This may allow for at least some range of motion of the first portion 1104 of the hinge 1102 even when the one or more third fastening elements 1125 are within the first one or more third horizontal holes 1124. As described above with respect to the first horizontal slotted hole 1114 and the first fastening element 1108, this may allow for adjustability of the first portion 1104 of the hinge 1102.

In some embodiments, the second portion 1106 of the hinge 1102 may include a second horizontal threaded hole 1126 and one or more second vertical holes 1116. The second portion 1106 of the hinge may be removably coupled to the housing of the enclosure, or may be permanently affixed to the housing, for example, through welding. That is, in the instances where the second portion 1106 may be permanently affixed to the housing, all of the movement and adjustability described herein with respect to the hinge 1102 may be a result of movement of the first portion 1104 of the hinge 1102 (for example, the movement of the door of the enclosure with respect to the housing of the enclosure through the movement of the first portion 1104 of the hinge 1102). In other instances, however, both the first portion 1104 and second portion 1106 may be moveable, or just the second portion 1106 may be moveable.

In some instances, the second horizontal threaded hole 1126 may be aligned with the first horizontal slotted hole 1114 of the first portion 1104 of the hinge 1102 such that the first fastening element 1108 may extend through the first horizontal slotted hole 1114 as well as the second horizontal threaded hole 1126. Thus, in addition to allowing adjustability of the hinge 1102, the first fastening element 1108 may also serve to attach the first portion 1104 and second portion 1106 of the hinge 1102. Additionally, although FIG. 11 only depicts the first fastening element 1108 as extending partially through the second horizontal threaded hole 1126, the first fastening element 1108 may extend through the entire length of the second portion 1106 as well (or any other length).

In some instances, the one or more second vertical holes 1116 of the second portion 1106 of the hinge 1102 may be aligned with the one or more first vertical holes 1122 of the first portion 1104 of the hinge 1102 such that the one or more second fastening elements 1100 may extend through the one or more first vertical holes 1122 as well as the one or more second vertical holes 1116. Thus, the one or more second fastening elements 1100 may also serve to attach the first portion 1104 and second portion 1106 of the hinge 1102. Additionally, at least a portion of the one or more second fastening elements 1100 may be threaded, and the threaded portion may be the portion of the one or more second fastening elements 1100 that is received within the one or more first vertical holes 1122 of the first portion 1104. This may allow the one or more second fastening elements 1110 to rotate within the one or more first vertical holes 1122, effectively resulting in a rotation of the first portion 1104, and along with it the door of the enclosure. Further, the one or more second vertical holes 1116 of the second portion 1106 of the hinge 1102 may include a gap 1118 such that the one or more retainers, bushing sleeves and/or washers for second fastening elements 1100 allow for horizontal and/or rotational movement of the first portion 1104 of the hinge 1102 relative to the second portion 1106, such as clockwise or counterclockwise rotation relative to the axis 1113. Alternatively, the portion of the one or more second fastening elements 1118 that is received within the one or more second vertical holes 1116 may simply be smaller in volume than the one or more second vertical holes 1116. This may allow for further adjustment of the first portion 1104 of the hinge 1102 relative to the second portion 1106, such as a clockwise 1132 or counterclockwise 1130 rotation relative to the axis 1113.

In some embodiments, as described above, the aforementioned configuration of the first portion 1104 and second portion 1106 of the hinge 1102 may allow for the hinge to be adjusted in multiple directions, such as, for example, front-to-back adjustability, side-to-side adjustability, and/or rotational adjustability (which may be front-to-back 1005 adjustability, side-to-side adjustability 1008, and/or rotational adjustability 1006 as described with reference to FIG. 10). As a result of this, the door of the enclosure that is removably attached to the first portion 1104 of the hinge 1102 may be adjusted relative to the housing of the enclosure to ensure an optimal seal between the two doors and the housing. This may be critical in scenarios where the enclosure includes electronics that need to be protected from exposure to water when the enclosure is located underwater, for example. Furthermore, the hinge 1102 depicted in FIG. 11 may be advantageous because the fastening elements (e.g., first fastening element 1108, one or more second fastening elements 1110, and/or one or more third fastening elements 1125 may not be exposed to an external environment of the hinge 1102).

Many modifications and other embodiments of the example descriptions set forth herein to which these descriptions pertain will come to mind having the benefit of the teachings presented in the foregoing descriptions and the associated drawings. Thus, it will be appreciated the disclosure may be embodied in many forms and should not be limited to the exemplary embodiments described above. Therefore, it is to be understood that the disclosure is not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed is:

1. An enclosure comprising:
a housing having an interior portion configured to accommodate an electrical network protection element;

one or more doors hingeably attached to the housing through one or more hinges, the one or more hinges comprising:
a first portion coupled to the one or more doors, the first portion comprising a horizontal slotted hole for receiving a first fastening element, and one or more vertical holes for receiving respective fastening elements; and
a second portion coupled to the housing, the second portion comprising a corresponding horizontal hole for receiving the first fastening element, and one or more corresponding vertical holes for receiving the respective fastening elements, wherein the first portion and second portion are connected by way of the first fastening element and the respective fastening elements,
wherein the horizontal slotted hole and the corresponding horizontal hole are configured to allow for rotation of the first portion about a horizontal axis when the first fastening element is not received in the corresponding horizontal hole, and the one or more vertical holes and the one or more corresponding vertical holes are configured to allow for rotation of the first portion about a vertical axis when the respective fastening element is received in the one or more corresponding vertical holes, and
wherein at least one of: the horizontal slotted hole, the one or more vertical holes, the corresponding horizontal hole, and the corresponding vertical holes include a threaded portion.

2. The enclosure of claim 1, wherein a hole size is greater than a corresponding fastening element received by the hole, the hole comprising at least one of:
the first horizontal slotted hole, the one or more first vertical holes, the second horizontal threaded hole, and the one or more second vertical holes.

3. The enclosure of claim 1, wherein the first portion of the one or more hinges further comprises one or more third horizontal holes that are perpendicular to the first horizontal slotted hole, and wherein the one or more third horizontal holes are configured to receive one or more third fastening elements, the first portion of the one or more hinges being coupled to the one or more doors through the one or more third fastening elements in the one or more third horizontal holes.

4. The enclosure of claim 1, wherein the threaded portion of at least one of the first horizontal slotted hole, the one or more first vertical holes, the second horizontal hole, and the one or more second vertical holes is unexposed to an external environmental of the one or more hinges.

5. An enclosure comprising:
a housing having an interior portion configured to accommodate an electrical network protection element;
one or more doors hingeably attached to the housing through one or more hinges, the one or more hinges comprising:
a first portion coupled to the one or more doors, the first portion comprising a first horizontal slotted hole for receiving a first fastening element, and one or more first vertical holes for receiving one or more second fastening elements; and
a second portion coupled to the housing, the second portion comprising a second horizontal threaded hole for receiving the first fastening element, and one or more second vertical holes for receiving the one or more second fastening elements, wherein the first portion and second portion are connected through the first fastening element and the one or more second fastening elements.

6. The enclosure of claim 5, wherein a hole size is greater than a corresponding fastening element received by the hole, the hole comprising at least one of:
the first horizontal slotted hole, the one or more first vertical holes, the second horizontal threaded hole, and the one or more second vertical holes.

7. The enclosure of claim 5, wherein the first horizontal slotted hole and second horizontal threaded hole are configured to allow for rotation of the first portion about a horizontal axis and the one or more first vertical holes and one or more second vertical holes are configured to allow for rotation of the first portion about a vertical axis.

8. The enclosure of claim 5, wherein the first portion of the one or more hinges further comprises one or more third horizontal holes that are perpendicular to the first horizontal slotted hole, and wherein the one or more third horizontal holes are configured to receive one or more third fastening elements, the first portion of the one or more hinges being coupled to the one or more doors through the one or more third fastening elements in the one or more third horizontal holes.

9. The enclosure of claim 5, wherein in the second portion of the one or more hinges is coupled to the housing through one or more fourth fastening elements or is welded to the housing.

10. The enclosure of claim 5, wherein at least one of: the first horizontal slotted hole, the first horizontal slotted hole, the one or more first vertical holes, the second horizontal threaded hole, and the one or more second vertical holes included a threaded portion.

11. The enclosure of claim 5, wherein the first fastening elements and one or more second fastening elements comprise threaded hardware.

12. The enclosure of claim 5, wherein a threaded portion of at least one of the first horizontal slotted hole, the one or more first vertical holes, the second horizontal hole, and the one or more second vertical holes is unexposed to an external environmental of the one or more hinges.

* * * * *